(12) United States Patent
Paek et al.

(10) Patent No.: US 9,563,120 B2
(45) Date of Patent: Feb. 7, 2017

(54) BLACK PHOTOSENSITIVE RESIN COMPOSITION AND LIGHT-BLOCKING LAYER USING THE SAME

(71) Applicant: Cheil Industries Inc., Gumi-si (KR)

(72) Inventors: Ho-Jeong Paek, Uiwang-si (KR); Do-Uk Kim, Uiwang-si (KR); Min-Sung Kim, Uiwang-si (KR); Lee-June Kim, Uiwang-si (KR); Jin-Woo Park, Uiwang-si (KR); Young-Tai Lee, Uiwang-si (KR); Young-Woong Jang, Uiwang-si (KR); Seung-Jib Choi, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 55 days.

(21) Appl. No.: 14/219,515

(22) Filed: Mar. 19, 2014

(65) Prior Publication Data

US 2015/0065598 A1 Mar. 5, 2015

(30) Foreign Application Priority Data

Sep. 2, 2013 (KR) ........................ 10-2013-0104963

(51) Int. Cl.
| | | |
|---|---|---|
| *G02B 1/04* | (2006.01) | |
| *G03F 7/027* | (2006.01) | |
| *G03F 7/032* | (2006.01) | |
| *G03F 7/033* | (2006.01) | |
| *G03F 7/035* | (2006.01) | |
| *G03F 7/037* | (2006.01) | |
| *G03F 7/105* | (2006.01) | |

(52) U.S. Cl.
CPC .............. *G03F 7/027* (2013.01); *G03F 7/032* (2013.01); *G03F 7/033* (2013.01); *G03F 7/035* (2013.01); *G03F 7/037* (2013.01); *G03F 7/105* (2013.01); *G02B 1/04* (2013.01)

(58) Field of Classification Search
None
See application file for complete search history.

(56) References Cited

U.S. PATENT DOCUMENTS

| | | | | |
|---|---|---|---|---|
| 3,229,507 A | * | 1/1966 | Sljaka .................... | G01N 33/32 73/54.23 |
| 4,619,905 A | * | 10/1986 | Natansohn .......... | C01B 21/0685 423/344 |
| 5,925,484 A | * | 7/1999 | Shima .................... | G02B 5/223 430/270.1 |
| 6,287,374 B1 | * | 9/2001 | Yanagida .............. | C09D 11/324 106/31.9 |

(Continued)

FOREIGN PATENT DOCUMENTS

| | | |
|---|---|---|
| JP | 09-133806 A | 5/1997 |
| JP | 10-010311 A | 1/1998 |

(Continued)

*Primary Examiner* — Peter A Salamon
(74) *Attorney, Agent, or Firm* — Additon, Higgins & Pendleton, P.A.

(57) ABSTRACT

A black photosensitive resin composition includes (A) pigment dispersion including at least two kinds of carbon black having different oil absorption from each other; (B) a binder resin; (C) a photopolymerizable monomer; (D) a photopolymerization initiator; and (E) a solvent. A light-blocking layer can be formed using the same.

9 Claims, 4 Drawing Sheets

(56) References Cited

U.S. PATENT DOCUMENTS

| | | | |
|---|---|---|---|
| 7,334,929 B2* | 2/2008 | Sato | G03F 7/0007 349/80 |
| 8,318,053 B2 | 11/2012 | Choi et al. | |
| 2001/0018158 A1* | 8/2001 | Yoshida | G03G 9/08782 430/119.86 |
| 2009/0004589 A1* | 1/2009 | Yuasa | G03G 9/0804 430/108.8 |
| 2009/0035682 A1* | 2/2009 | Shima | G03G 9/0804 430/108.4 |
| 2009/0111048 A1* | 4/2009 | Miyabe | G02B 3/0068 430/270.1 |
| 2009/0280416 A1* | 11/2009 | Einaga | G03F 7/0007 430/7 |
| 2010/0167197 A1* | 7/2010 | Yuasa | G03G 9/0804 430/112 |
| 2010/0216937 A1* | 8/2010 | Nagashima | C09D 11/324 524/558 |
| 2010/0243970 A1* | 9/2010 | Toshimitsu | G02B 5/223 252/582 |
| 2012/0077897 A1* | 3/2012 | Choi | C08K 3/04 522/81 |
| 2012/0199727 A1* | 8/2012 | Kubota | G03F 7/033 250/214.1 |
| 2013/0344437 A1 | 12/2013 | Yang et al. | |
| 2015/0065598 A1* | 3/2015 | Paek | G03F 7/037 522/8 |

FOREIGN PATENT DOCUMENTS

| | | |
|---|---|---|
| JP | 2002-047423 A | 2/2002 |
| JP | 2007-071994 A | 3/2007 |
| JP | 2007-233230 A | 9/2007 |
| JP | 2007233230 A * | 9/2007 |
| JP | 2010-235739 A | 10/2010 |
| KR | 10-2008-0032148 A | 4/2008 |
| KR | 10-2011-0056223 A | 5/2011 |
| KR | 10-2011-0062157 A | 6/2011 |
| TW | 201227173 A | 7/2012 |

* cited by examiner

BLACK PHOTOSENSITIVE RESIN COMPOSITION AND LIGHT-BLOCKING LAYER USING THE SAME

CROSS-REFERENCE TO RELATED APPLICATION

This application claims priority to and the benefit of Korean Patent Application No. 10-2013-0104963 filed in the Korean Intellectual Property Office on Sep. 2, 2013, the entire disclosure of which is incorporated herein by reference.

FIELD OF THE INVENTION

This disclosure relates to a black photosensitive resin composition and a light-blocking layer using the same.

BACKGROUND OF THE INVENTION

A black photosensitive resin composition is necessarily used to fabricate a display element for a color filter, a liquid crystal display material, an organic light emitting element (EL), a display panel material, and the like. For example, a color filter such as a color liquid crystal display and the like needs a light blocking layer on the border between colored layers such as red, green, blue, and the like to enhance display contrast or chromophore effects. This light blocking layer may be mainly formed of a black photosensitive resin composition.

Recently there has been increased focus on the manufacture a liquid crystal display having high resolution but a smaller size. Accordingly, a fine light-blocking layer needs to be manufactured, and a shape in a fine pattern also becomes more important. In addition, close-contacting (adhesive) force between the light-blocking layer and a glass according to minimization of a bezel part becomes more important.

Many patents are directed to black photosensitive resin compositions. Japanese Patent Laid-Open Publication No. 2002-047423 discloses a cobalt oxide as a black pigment to realize a black matrix with high blackness and insulation properties. In addition, Japanese Patent Laid-Open Publication No. 2007-071994 uses a black matrix material including a perylene-based compound. However, these materials have a problem of controlling a taper angle. Thus these materials may not form a fine pattern film and can exhibit deteriorated adhesive (close-contacting) force.

SUMMARY OF THE INVENTION

One embodiment of the present invention provides a black photosensitive resin composition that can provide control of a taper angle and thus can form a fine pattern and can have an excellent close-contacting (adhesive) force.

Another embodiment of the present invention provides a light blocking layer manufactured using the black photosensitive resin composition.

One embodiment of the present invention provides a black photosensitive resin composition including (A) pigment dispersion including at least two kinds of carbon black having different oil absorption from each other; (B) a binder resin; (C) a photopolymerizable monomer; (D) a photopolymerization initiator; and (E) a solvent.

The pigment dispersion may include carbon black having oil absorption ranging from about 20 ml/100 g to about 40 ml/100 g and another carbon black having oil absorption ranging from about 60 ml/100 g to about 80 ml/100 g.

The carbon black having oil absorption ranging from about 20 ml/100 g to about 40 ml/100 g and the other carbon black having oil absorption ranging from about 60 ml/100 g to about 80 ml/100 g can be included in a weight ratio ranging from about 1:99 to about 99:1.

The carbon black having oil absorption ranging from about 20 ml/100 g to about 40 ml/100 g and the other carbon black having oil absorption ranging from about 60 ml/100 g to about 80 ml/100 g can be included in a weight ratio ranging from about 20:80 to about 80:20.

The carbon black may have a primary particle diameter of about 10 nm to about 50 nm.

The binder resin may include a cardo-based binder resin, an acrylic-based binder resin, a polyimide-based binder resin, a polyurethane-based binder resin, or a combination thereof.

The binder resin may be a cardo-based binder resin, and the cardo-based binder resin may have a weight average molecular weight of about 1,000 g/mol to about 50,000 g/mol.

The black photosensitive resin composition may include about 1 wt % to about 50 wt % of the pigment dispersion (A); about 0.5 wt % to about 20 wt % of the binder resin (B); about 1 wt % to about 20 wt % of the photopolymerizable monomer (C); about 0.1 wt % to about 10 wt % of the photopolymerization initiator (D); and balance of the solvent (E).

The black photosensitive resin composition may further include at least one additive selected from malonic acid; 3-amino-1,2-propanediol; a coupling agent having a vinyl group or a (meth)acryloxy group; a leveling agent; a fluorine-based surfactant; and a radical polymerization initiator.

Another embodiment of the present invention provides a light blocking layer manufactured using the black photosensitive resin composition.

Other embodiments of the present invention are included in the following detailed description.

The black photosensitive resin composition may provide a light-blocking layer having a high resolution and an excellent close-contacting force, since a fine pattern can be formed by controlling a taper angle.

DETAILED DESCRIPTION

The present invention now will be described more fully hereinafter in the following detailed description of the invention, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a specific definition is not otherwise provided, the term "alkyl group" refers to a C1 to C20 alkyl group, the term "alkenyl group" refers to a C2 to C20 alkenyl group, the term "cycloalkenyl group" refers to a C3 to C20 cycloalkenyl group, the term "heterocycloalkenyl group" refers to a C3 to C20 heterocycloalkenyl group, the term "aryl group" refers to a C6 to C20 aryl group, the term "arylalkyl group" refers to a C6 to C20 arylalkyl group, the term "alkylene group" refers to a C1 to C20 alkylene group, the term "arylene group" refers to a C6 to C20 arylene group, the term "alkylarylene group" refers to a C6 to C20 alkylarylene group, the term "heteroarylene group" refers to a C3 to C20 heteroarylene group, and the term "alkoxylene group" refers to a C1 to C20 alkoxylene group.

As used herein, when a specific definition is not otherwise provided, the term "substituted" refers to one substituted with a substituent including a halogen (F, Cl, Br, I), a hydroxy group, a C1 to C20 alkoxy group, a nitro group, a cyano group, an amine group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C20 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, a C3 to C20 heteroaryl group, or a combination thereof, instead of at least one hydrogen.

As used herein, when a specific definition is not otherwise provided, the term "hetero" refers to one including at least one heteroatom including N, O, S and/or P instead of at least one carbon atom in a cyclic group.

As used herein, when a specific definition is not otherwise provided, "(meth)acrylate" refers to both "acrylate" and "methacrylate", and "(meth)acrylic acid" refers "acrylic acid" and "methacrylic acid".

As used herein, when a specific definition is not otherwise provided, "combination" refers to a mixture or a copolymerization.

A black photosensitive resin composition according to one embodiment includes (A) pigment dispersion including at least two kinds of carbon black having different oil absorption from each other; (B) a binder resin; (C) a photopolymerizable monomer; (D) a photopolymerization initiator; and (E) a solvent.

The pigment dispersion is prepared by mixing at least two kinds of carbon black having different oil absorptions from each other, and the use thereof can provide control of a taper angle. Accordingly, a light-blocking layer formed using the same can exhibit a high close-contacting force and may have a fine pattern with a desired shape and size.

Hereinafter, each component is specifically illustrated.

(A) Pigment Dispersion

The pigment dispersion includes at least two kinds of carbon black having different oil absorption from each other.

The term "oil absorption" indicates the amount of oil added to carbon black and required to make dough having a predetermined fluidity. In general, the amount of oil is designated as ml based on 100 g of a pigment.

When at least two kinds of carbon black having different oil absorptions from each other are mixed to prepare a pigment, a fine pattern may be formed and further a pattern can be designed to have a desired shape and size by adjusting a taper angle. Using at least two kinds of carbon black having different oil absorptions can also provide a light-blocking layer having an excellent close-contacting force.

The carbon black may be used as a pigment, the pigment is mixed with a dispersing agent, a solvent, and the like to prepare a pigment dispersion, and the pigment dispersion is included in a black photosensitive resin composition. Specifically, the pigment dispersion may be obtained by mixing the carbon black, the dispersing agent, and the solvent.

The carbon black is in general classified based on a primary particle diameter and/or a structure. Specifically, the classification of carbon black based on the primary particle diameter can be based on the size of the primary particle diameter, and the classification of carbon black based on the structure can be based on the structural differences of the carbon black and is related to the secondary particle diameter of the carbon black. As used herein, the term 'primary particle diameter' of the carbon black indicates a diameter of a carbon black particle measured by using a transparent electron microscope (TEM), an X-ray diffraction device (XRD), or the like, and the term 'secondary particle diameter' of the carbon black indicates a size of a secondary particle formed when the primary particles are connected like a chain in a multidirection and can be an indication of oil absorption.

In other words, carbon black having a small secondary particle diameter can have a lower oil absorption, and carbon black having a large secondary particle diameter can have a higher oil absorption. Accordingly, the classification of the carbon black based on the structure is the same as classification of the carbon black based on oil absorption. Thus, carbon black may have the same primary particle diameter but different secondary particle diameter and thus different oil absorption.

At least two kinds of carbon black having different oil absorptions from each other may have, for example, oil absorption ranging from about 20 ml/100 g to about 40 ml/100 g and also, from about 60 ml/100 g to about 80 ml/100 g.

In some embodiments, the black photosensitive resin composition may include carbon black having oil absorption of about 20, 21, 22, 23, 24, 25, 26, 27, 28, 29, 30, 30, 31, 32, 33, 34, 35, 36, 37, 38, 39, or 40 ml/100 g. Further, according to some embodiments of the present invention, the oil absorption of one of the carbon blacks can be in a range from about any of the foregoing amounts to about any other of the foregoing amounts.

In some embodiments, the black photosensitive resin composition may include a different carbon black having oil absorption of about 60, 61, 62, 63, 64, 65, 66, 67, 68, 69, 70, 71, 72, 73, 74, 75, 76, 77, 78, 79, or 80 ml/100 g. Further, according to some embodiments of the present invention, the oil absorption of the other of the carbon blacks can be in a range from about any of the foregoing amounts to about any other of the foregoing amounts.

The carbon black having oil absorption of about 20 ml/100 g to about 40 ml/100 g may have small primary and secondary particle diameters, while the carbon black having oil absorption of about 60 ml/100 g to about 80 ml/100 g may have a small primary particle diameter but a large secondary particle diameter.

The carbon black having oil absorption of about 20 ml/100 g to about 40 ml/100 g may have small primary and secondary particle diameters and thus can provide excellent linearity of a pattern. In contrast, the carbon black having oil absorption of about 60 ml/100 g to about 80 ml/100 g can have a small primary particle diameter but a large secondary particle diameter and can provide excellent adhesive (close-contacting) force. Accordingly, when at least two kinds of carbon black having different oil absorptions are mixed, optical density of a fine pattern may be maintained in a predetermined level, and taper angle of the fine pattern may be controlled, and thus, a close-contacting force may be improved.

Specifically, the fine pattern may have a taper angle in a range of about 40° to about 80°. When the taper angle is controlled within this range, a light-blocking layer having excellent linearity of the pattern and an improved close-contacting force may be obtained.

When the taper angle is smaller than about 40°, the pattern may have a thinner edge and leak light. When the taper angle is higher than about 80°, a large pH difference can be generated in a post processing step and may deteriorate a liquid crystal margin.

The carbon black having oil absorption of about 20 ml/100 g to about 40 ml/100 g and the other carbon black having oil absorption of about 60 ml/100 g to about 80 ml/100 g may be mixed in a weight ratio of about 1:99 to about 99:1 and included in a black photosensitive resin composition.

In some embodiments, the mixture of the carbon black can include the carbon black with oil absorption of about 20 ml/100 g to about 40 ml/100 g in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, or 99 wt %. Further, according to some embodiments of the present invention, the amount of the carbon black with oil absorption of about 20 ml/100 g to about 40 ml/100 g can be in a range from about any of the foregoing amounts to about any other of the foregoing amounts.

In some embodiments, the mixture of the carbon black can include the carbon black with oil absorption of about 60 ml/100 g to about 80 ml/100 g in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, or 99 wt %. Further, according to some embodiments of the present invention, the amount of the carbon black with oil absorption of about 60 ml/100 g to about 80 ml/100 g can be in a range from about any of the foregoing amounts to about any other of the foregoing amounts.

When the carbon blacks are mixed in an amount within the above weight ratio range, a fine pattern may be formed, and a light-blocking layer having an excellent close-contacting force may be easily obtained.

For example, the carbon black having oil absorption of about 20 ml/100 g to about 40 ml/100 g and the other carbon black having oil absorption of about 60 ml/100 g to about 80 ml/100 g may be mixed in a weight ratio of about 20:80 to about 80:20.

The carbon black may have a primary particle diameter of about 10 nm to about 50 nm. For example, the carbon black may have a primary particle diameter of about 20 nm to about 40 nm. When the carbon black has a primary particle diameter within the above range, the carbon black may have excellent stability in pigment dispersion.

The carbon black has no particular limit. Examples of the carbon black may include without limitation graphitized carbon, furnace black, acetylene black, ketjen black, and the like, and combinations thereof.

The dispersing agent may help uniformly disperse the carbon black in the solvent.

Examples of the dispersing agent may include without limitation non-ionic compounds, anionic compounds, cationic compounds, and combinations thereof. Specific examples may include without limitation polyalkylene glycols and esters thereof, polyoxyalkylenes, polyhydric alcohol ester alkyleneoxide addition products, alcohol alkyleneoxide addition products, sulfonic acid esters, sulfonate salts, carboxylic esters, carboxylate salts, alkylamide alkyleneoxide addition products, alkylamines, and the like, and combinations thereof.

Commercially available examples of the dispersing agent may include without limitation DISPERBYK-101, DISPERBYK-130, DISPERBYK-140, DISPERBYK-160, DISPERBYK-161, DISPERBYK-162, DISPERBYK-163, DISPERBYK-164, DISPERBYK-165, DISPERBYK-166, DISPERBYK-170, DISPERBYK-171, DISPERBYK-182, DISPERBYK-2000, DISPERBYK-2001, and the like made by BYK CO., LTD.; EFKA-47, EFKA-47EA, EFKA-48, EFKA-49, EFKA-100, EFKA-400, EFKA-450, and the like made by EFKA Chemicals CO.; Solsperse 5000, Solsperse 12000, Solsperse 13240, Solsperse 13940, Solsperse 17000, Solsperse 20000, Solsperse 24000GR, Solsperse 27000, Solsperse 28000, and the like made by Zeneka CO.; PB711, PB821, and the like made by Ajinomoto INC.; and the like, and combinations thereof.

The black photosensitive resin composition may include the dispersing agent in an amount of about 0.1 wt % to about 15 wt % based on the total weight (100 wt %) of the black photosensitive resin composition. In some embodiments, the black photosensitive resin composition may include the dispersing agent in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, or 15 wt %. Further, according to some embodiments of the present invention, the amount of the dispersing agent can be in a range from about any of the foregoing amounts to about any other of the foregoing amounts.

When the dispersing agent is included in an amount within the above range, the black photosensitive resin composition can have excellent dispersion property and thus, may form a light blocking layer that can have excellent stability, developability, and/or pattern-forming capability.

The solvent is the same as solvent (E) described below.

The black photosensitive resin composition may include the pigment dispersion in an amount of about 1 wt % to about 50 wt %, for example about 10 to wt % about 40 wt %, based on the total weight (100 wt %) of the black photosensitive resin composition. In some embodiments, the black photosensitive resin composition may include the pigment dispersion in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 30, 31, 32, 33, 34, 35, 36, 37, 38, 39, 40, 41, 42, 43, 44, 45, 46, 47, 48, 49, or 50 wt %. Further, according to some embodiments of the present invention, the amount of the pigment dispersion can be in a range from about any of the foregoing amounts to about any other of the foregoing amounts.

When the pigment dispersion is included in an amount within the above range, a light-blocking layer having excellent insulation, maintaining a predetermined optical density, and/or having an excellent close-contacting force may be obtained.

(B) Binder Resin

The binder resin may be a cardo-based binder resin, an acrylic-based binder resin, a polyimide-based binder resin, a polyurethane-based binder resin or a combination thereof.

The binder resin may have a weight average molecular weight of about 1,000 g/mol to about 150,000 g/mol.

In one embodiment, the binder resin may be the cardo-based binder resin or a mixture of the cardo-based binder resin and the acrylic-based binder resin. The binder resin may improve heat resistance and/or chemical resistance of the black photosensitive resin composition.

The cardo-based binder resin may have a weight average molecular weight of about 1,000 g/mol to about 50,000 g/mol, for example about 3,000 g/mol to about 35,000 g/mol. When the cardo-based binder resin has a weight average molecular weight within the above range, pattern-forming capability and developability may be improved during manufacture of a light blocking layer.

The cardo-based binder resin may be a compound including a repeating unit represented by the following Chemical Formula 1.

[Chemical Formula 1]

In the above Chemical Formula 1,

$R_{24}$ to $R_{27}$ are the same or different and are each independently hydrogen, halogen, or substituted or unsubstituted C1 to C20 alkyl,

$R_{28}$ and $R_{29}$ are the same or different and are each independently hydrogen or $CH_2OR_a$ (wherein $R_a$ is a vinyl group, an acryl group or a methacryl group), each $R_{30}$ is independently hydrogen, substituted or unsubstituted C1 to C20 alkyl, substituted or unsubstituted C2 to C20 alkenyl, an acryl group, or a methacryl group, each $Z_1$ is independently a single bond, O, CO, $SO_2$, $CR_bR_c$, $SiR_dR_e$ (wherein $R_b$ to $R_e$ are the same or different and are each independently hydrogen or substituted or unsubstituted C1 to C20 alkyl), or one selected from linkers represented by the following Chemical Formulae 2 to 12, and each $Z_2$ is independently an acid anhydride residual group or acid dianhydride residual group.

[Chemical Formula 2]

[Chemical Formula 3]

[Chemical Formula 4]

[Chemical Formula 5]

[Chemical Formula 6]

In the above Chemical Formula 6, $R_f$ is hydrogen, ethyl, $C_2H_4Cl$, $C_2H_4OH$, $CH_2CH{=}CH_2$, or phenyl.

[Chemical Formula 7]

[Chemical Formula 8]

[Chemical Formula 9]

[Chemical Formula 10]

[Chemical Formula 11]

[Chemical Formula 12]

The cardo-based binder resin may be obtained by reacting a compound represented by the following Chemical Formula 13 with tetracarboxylic acid dianhydride.

[Chemical Formula 13]

The tetracarboxylic acid dianhydride may be an aromatic tetracarboxylic acid dianhydride. Examples of the aromatic tetracarboxylic acid dianhydride may include without limitation pyromellic dianhydride, 3,3',4,4'-biphenyltetracarboxylic acid dianhydride, 2,3,3',4-biphenyltetracarboxylic acid dianhydride, 2,2',3,3'-biphenyltetracarboxylic acid dianhydride, 3,3',4,4'-benzophenonetetracarboxylic acid dianhydride, 3,3',4,4'-biphenylethertetracarboxylic acid dianhydride, 3,3',4,4'-diphenylsulfonetetracarboxylic acid dianhydride, 1,2,3,4-cyclopentanetetracarboxylic acid dianhydride, 1,2,5,6-naphthalenetetracarboxylic acid dianhydride, 2,3,6,7-naphthalenetetracarboxylic acid dianhydride, 1,4,5,8-naphthalenetetracarboxylic acid dianhydride, 2,3,5,6-pyridinetetracarboxylic acid dianhydride, 3,4,9,10-perylenetetracarboxylic acid dianhydride, 2,2-bis(3,4-dicarboxylphenyl)hexafluoropropane dianhydride, and the like, and combinations thereof.

The acrylic-based binder resin is a copolymer of a first ethylenic unsaturated monomer and a second ethylenic unsaturated monomer that is copolymerizable with the first ethylenic unsaturated monomer, and is a resin including at least one acrylic-based repeating unit.

The first ethylenic unsaturated monomer is an ethylenic unsaturated monomer including at least one carboxyl group. Examples of the first ethylenic unsaturated monomer include without limitation acrylic acid, methacrylic acid, maleic acid, itaconic acid, fumaric acid, and the like, and combinations thereof.

The acrylic-based binder resin may include the first ethylenic unsaturated monomer in an amount ranging from about 5 wt % to about 50 wt %, for example, from about 10 wt % to about 40 wt %, based on the total amount (100 wt %) of the acrylic-based binder resin.

Examples of the second ethylenic unsaturated monomer may include without limitation aromatic vinyl compounds such as styrene, α-methylstyrene, vinyltoluene, vinylbenzylmethylether, and the like; unsaturated carboxylic acid ester compounds such as methyl(meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl(meth)acrylate, phenyl(meth)acrylate, and the like; unsaturated carboxylic acid amino alkyl ester compounds such as 2-aminoethyl(meth)acrylate, 2-dimethylaminoethyl(meth)acrylate, and the like; carboxylic acid vinyl ester compounds such as vinyl acetate, vinyl benzoate, and the like; unsaturated carboxylic acid glycidyl ester compounds such as glycidyl(meth)acrylate and the like; vinyl cyanide compounds such as (meth)acrylonitrile and the like; unsaturated amide compounds such as (meth)acrylamide and the like; and the like. They may be used singularly or as a mixture of two or more.

Examples of the acrylic-based binder resin may include without limitation a methacrylic acid/benzylmethacrylate copolymer, a methacrylic acid/benzyl methacrylate/styrene copolymer, a methacrylic acid/benzylmethacrylate/2-hydroxyethylmethacrylate copolymer, a methacrylic acid/benzylmethacrylate/styrene/2-hydroxyethylmethacrylate copolymer and the like. They may be used singularly or as a mixture of two or more.

The acrylic-based binder resin may have a weight average molecular weight ranging from about 3,000 g/mol to about 150,000 g/mol, for example about 5,000 g/mol to about 50,000 g/mol, and as another example about 20,000 g/mol to about 30,000 g/mol. When the acrylic-based binder resin has a weight average molecular weight within the above range, the black photosensitive resin composition can have good physical and chemical properties, appropriate viscosity, and/or close contacting properties with a substrate when being applied to a light blocking layer.

The acrylic-based resin may have an acid value ranging from about 15 mgKOH/g to about 60 mgKOH/g, for example about 20 mgKOH/g to about 50 mgKOH/g. When acrylic-based binder resin has an acid value within the above range, excellent pixel resolution may be realized.

When the cardo-based binder resin is mixed with the acrylic-based binder resin, the acrylic-based binder resin may be included in an amount of greater than 0 wt % and less than or equal to about 20 wt % based on 100 wt % of a binder resin. In some embodiments, a mixture of the cardo-based binder resin and the acrylic-based binder resin can include the acrylic-based binder resin in an amount of about 1, 2, 3, 4, 5, 6, 7, 8, 9, 10, 11, 12, 13, 14, 15, 16, 17, 18, 19, or 20 wt %. Further, according to some embodiments of the present invention, the amount of the acrylic-based binder resin can be in a range from about any of the foregoing amounts to about any other of the foregoing amounts.

When the acrylic-based binder resin is included in an amount within the above range, developability can be improved. When the acrylic-based binder resin is included in an amount greater than about 20 wt %, a process margin may be deteriorated.

The black photosensitive resin composition may include the binder resin in an amount of about 0.5 wt % to about 20 wt %, for example about 1 wt % to about 10 wt %, based on the total amount (100 wt %) of the black photosensitive resin composition. In some embodiments, the black photosensitive resin composition may include the binder resin in an amount of about 0.5, 0.6, 0.7, 0.8, 0.9, 1, 2, 3, 4, 5, 6, 7, 8, 9, 10, 11, 12, 13, 14, 15, 16, 17, 18, 19, or 20 wt %. Further, according to some embodiments of the present invention, the amount of binder resin can be in a range from about any of the foregoing amounts to about any other of the foregoing amounts.

When the binder resin is included in an amount within the above range, pattern-forming capability, processibility, and/or developability viscosity may be improved during manufacture of a light blocking layer due to an appropriate viscosity.

(C) Photopolymerizable Monomer

The photopolymerizable monomer may be a generally-used monomer and/or oligomer in a photosensitive resin composition. It may be a mono-functional and/or multi-functional ester of (meth)acrylic acid including at least one ethylenic unsaturated double bond.

Examples of the photopolymerizable monomer may include without limitation ethylene glycol diacrylate, ethylene glycol dimethacrylate, diethylene glycol diacrylate, triethylene glycol diacrylate, triethylene glycol dimethacrylate, 1,6-hexanediol diacrylate, 1,6-hexanediol dimethacrylate, pentaerythritol triacrylate, pentaerythritol tetraacrylate, dipentaerythritol pentaacrylate, dipentaerythritol hexaacrylate, bisphenol A epoxyacrylate, ethyleneglycolmonomethylether acrylate, trimethylolpropane triacrylate, trisacryloyloxyethyl phosphate, and the like, and combinations thereof.

Commercially available examples of the photopolymerizable monomer are as follows. The mono-functional (meth) acrylic acid ester may include without limitation Aronix M-101®, M-111®, M-114® (TOAGOSEI CHEMICAL INDUSTRY Co., Ltd.); KAYARAD TC-110S®, TC-120S® (NIPPON KAYAKU Co., Ltd.); V-158®, V-2311® (OSAKA ORGANIC CHEMICAL IND., LTD.), and the like. Examples of a difunctional (meth)acrylic acid ester may include without limitation Aronix M-210®, M-240®, M-6200® (TOAGOSEI CHEMICAL INDUSTRY Co., Ltd.), KAYARAD HDDA®, HX-220®, R-604® (NIPPON KAYAKU Co., Ltd.), V-260®, V-312®, V-335 HP® (OSAKA ORGANIC CHEMICAL IND., LTD.), and the like. Examples of a tri-functional (meth)acrylic acid ester may include without limitation Aronix M-309®, M-400®, M-405®, M-450®, M-7100®, M-8030®, M-8060® (TOAGOSEI CHEMICAL INDUSTRY Co., Ltd.), KAYARAD TMPTA®, DPCA-20®, DPCA-30®, DPCA-60®, DPCA-120® (NIPPON KAYAKU Co., Ltd.), V-295®, V-300®, V-360®, V-GPT®, V-3PA®, V-400® (Osaka Yuki Kayaku Kogyo CO. LTD.), and the like. These may be used singularly or as a mixture of two or more.

The black photosensitive resin composition may include the photopolymerizable monomer in an amount ranging from about 1 wt % to about 20 wt %, for example about 1 wt % to about 15 wt %, based on the total amount (100 wt %) of the black photosensitive resin composition. The black photosensitive resin composition may include the photopolymerization monomer in an amount of about 1, 2, 3, 4, 5, 6, 7, 8, 9, 10, 11, 12, 13, 14, 15, 16, 17, 18, 19, or 20 wt %. Further, according to some embodiments of the present invention, the amount of photopolymerization monomer can be in a range from about any of the foregoing amounts to about any other of the foregoing amounts.

When the photopolymerizable monomer is included in an amount within the above range, compatibility with the binder resin may be improved, pattern-forming capability during manufacture of a light blocking layer and sensitivity under oxygen may be improved, and a film having a smooth surface may be obtained.

(D) Photopolymerization Initiator

The photopolymerization initiator may be a generally-used photopolymerization initiator in a photosensitive resin composition. Examples of the photopolymerization initiators may include without limitation acetophenone-based compounds, benzophenone-based compounds, thioxanthone-based compounds, benzoin-based compounds, triazine-based compounds, oxime-based compounds, and the like, and the like and combinations thereof.

Examples of the acetophenone-based compound may include without limitation 2,2'-diethoxy acetophenone, 2,2'-dibutoxy acetophenone, 2-hydroxy-2-methylpropinophenone, p-t-butyltrichloro acetophenone, p-t-butyldichloro acetophenone, 4-chloro acetophenone, 2,2'-dichloro-4-phenoxy acetophenone, 2-methyl-1-(4-(methylthio)phenyl)-2-morpholinopropan-1-one, 2-benzyl-2-dimethylamino-1-(4-morpholinophenyl)-butan-1-one, and the like, and combinations thereof.

Examples of the benzophenone-based compound may include without limitation benzophenone, benzoyl benzoate, benzoyl methyl benzoate, 4-phenyl benzophenone, hydroxy benzophenone, acrylated benzophenone, 4,4'-bis(dimethyl amino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and the like, and combinations thereof.

Examples of the thioxanthone-based compound may include without limitation thioxanthone, 2-methylthioxanthone, isopropyl thioxanthone, 2,4-diethyl thioxanthone, 2,4-diisopropyl thioxanthone, 2-chlorothioxanthone, and the like, and combinations thereof.

Examples of the benzoin-based compound may include without limitation benzoin, benzoin methyl ether, benzoin ethyl ether, benzoin isopropyl ether, benzoin isobutyl ether, benzyldimethylketal, and the like, and combinations thereof.

Examples of the triazine-based compound may include without limitation 2,4,6-trichloro-s-triazine, 2-phenyl 4,6-bis(trichloromethyl)-s-triazine, 2-(3',4'-dimethoxystyryl)-4, 6-bis(trichloromethyl)-s-triazine, 2-(4'-methoxynaphthyl)-4, 6-bis(trichloromethyl)-s-triazine, 2-(p-methoxyphenyl)-4,6-bis(trichloromethyl)-s-triazine, 2-(p-tolyl)-4,6-bis(trichloro methyl)-s-triazine, 2-biphenyl 4,6-bis(trichloromethyl)-s-triazine, bis(trichloromethyl)-6-styryl-s-triazine, 2-(naphto-1-yl)-4,6-bis(trichloromethyl)-s-triazine, 2-(4-methoxynaphto-1-yl)-4,6-bis(trichloromethyl)-s-triazine, 2,4-bis(trichloromethyl)-6-piperonyl-s-triazine, 2,4-bis(trichloromethyl)-6-(4-methoxystyryl)-s-triazine, and the like, and combinations thereof.

Examples of the oxime-based compound may include without limitation O-acyloxime-based compounds, 2-(O-benzoyloxime)-1-[4-(phenylthio)phenyl]-1,2-octandione, 1-(O-acetyloxime)-1-[9-ethyl-6-(2-methylbenzoyl)-9H-carbazol-3-yl]ethanone, O-ethoxycarbonyl-α-oxyamino-1-phenylpropan-1-one, and the like, and combinations thereof. Specific examples of the O-acyloxime-based compound may include without limitation 1,2-octandione, 2-dimethylamino-2-(4-methylbenzyl)-1-(4-morpholine-4-yl-phenyl)-butan-1-one, 1-(4-phenylsulfanyl phenyl)-butane-1,2-dione-2-oxime-O-benzoate, 1-(4-phenylsulfanyl phenyl)-octane-1, 2-dione-2-oxime-O-benzoate, 1-(4-phenylsulfanyl phenyl)-octan-1-oneoxime-O-acetate and 1-(4-phenylsulfanyl phenyl)-butan-1-oneoxime-O-acetate, and the like, and combinations thereof.

Other examples of the photopolymerization initiator may further include without limitation carbazole-based compounds, diketone-based compounds, sulfonium borate-based compounds, diazo-based compounds, biimidazole-based compounds, and the like, and combinations thereof.

Since the photopolymerization initiator absorbs light and is excited and then transmits energy, it may be used with a photo-sensitizer causing a chemical reaction.

The black photosensitive resin composition may include the photopolymerization initiator in an amount of about 0.1 wt % to about 10 wt %, for example about 0.5 wt % to 3 wt %, based on the total amount (100 wt %) of the black photosensitive resin composition. In some embodiments, the black photosensitive resin composition may include the photopolymerization initiator in an amount of about 0.1, 0.2, 0.3, 0.4, 0.5, 0.6, 0.7, 0.8, 0.9, 1, 2, 3, 4, 5, 6, 7, 8, 9, or 10 wt %. Further, according to some embodiments of the present invention, the amount of photopolymerization initiator can be in a range from about any of the foregoing amounts to about any other of the foregoing amounts.

When the photopolymerization initiator is included in an amount within the above range, radical sensitivity may be improved, surface deterioration of a pattern due to development may be minimized, and/or fume generation due to a non-reaction initiator may be prevented.

(E) Solvent

The solvent has compatibility with the pigment dispersion, the binder resin, the photopolymerizable monomer and the photopolymerization initiator, but does not react therewith.

Examples of the solvent may include without limitation alcohols such as methanol, ethanol, and the like; ethers such as dichloroethyl ether, n-butyl ether, diisoamyl ether, methylphenyl ether, tetrahydrofuran, and the like; glycol ethers such as ethylene glycol methylether, ethylene glycol ethylether, propylene glycol methylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylether acetate, propylene glycol propylether acetate, and the like; aromatic hydrocarbons such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; lactate alkyl esters such as methyl lactate, ethyl lactate, and the like; alkyl hydroxy acetate esters such as methyl hydroxyacetate, ethyl hydroxyacetate, butyl hydroxyacetate, and the like; alkoxyalkyl acetate esters such as methoxymethyl acetate, methoxyethyl acetate, methoxybutyl acetate, ethoxymethyl acetate, ethoxyethyl acetate, and the like; alkyl 3-hydroxypropionate esters such as methyl 3-hydroxypropionate, ethyl 3-hydroxypropionate, and the like; alkyl 3-alkoxypropionate esters such as methyl 3-methoxypropionate, ethyl 3-methoxypropionate, ethyl 3-ethoxypropionate, methyl 3-ethoxypropionate, and the like; alkyl 2-hydroxypropionate esters such as methyl 2-hydroxypropionate, ethyl 2-hydroxypropionate, propyl 2-hydroxypropionate, and the like; alkyl 2-alkoxypropionate esters such as methyl 2-methoxypropionate, ethyl 2-methoxypropionate, ethyl 2-ethoxypropionate, methyl 2-ethoxypropionate, and the like; alkyl 2-hydroxy-2-methylpropionate esters such as methyl 2-hydroxy-2-methylpropionate, ethyl 2-hydroxy-2-methylpropionate, and the like; alkyl 2-alkoxy-2-methylpropionate esters such as methyl 2-methoxy-2-methylpropionate, ethyl 2-ethoxy-2-methylpropionate, and the like; esters such as 2-hydroxyethyl propionate, 2-hydroxy-2-methylethyl propionate, hydroxyethyl acetate, methyl 2-hydroxy-3-methylbutanoate, and the like; ketonate esters such as ethyl pyruvate, and the like, and combinations thereof. Additionally, the following solvents may be also used: N-methylformamide, N,N-dimethyl formamide, N-methylformanilide, N-methylacetamide, N,N-dimethyl acetamide, N-methylpyrrolidone, dimethylsulfoxide, benzylethylether, dihexylether, acetylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, ethylene carbonate, propylene carbonate, phenyl cellosolve acetate, and the like. These solvents may be used singularly or as a mixture of two or more.

Considering miscibility and reactivity, glycol ethers such as ethylene glycol monoethylether, and the like; ethylene glycol alkylether acetates such as ethyl cellosolve acetate, and the like; esters such as 2-hydroxy ethyl propionate, and the like; diethylene glycols such as diethylene glycol monomethylether, and the like; propylene glycol alkylether acetates such as propylene glycol methylether acetate, propylene glycol propylether acetate, and the like, and combinations thereof may be used.

The black photosensitive resin composition may include the solvent in a balance amount, for example about 40 wt % to about 70 wt %, based on the total amount (100 wt %) of the black photosensitive resin composition. In some embodiments, the black photosensitive resin composition may include the solvent in an amount of about 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, or 70 wt %. Further, according to some embodiments of the present invention, the amount of solvent can be in a range from about any of the foregoing amounts to about any other of the foregoing amounts.

When the solvent is included in an amount within the above range, the black photosensitive resin composition may have an appropriate viscosity, which can improve coating characteristics of a light blocking layer.

(F) Other Additive(s)

The black photosensitive resin composition may further include one or more other additives such as but not limited to malonic acid; 3-amino-1,2-propanediol; silane-based coupling agents having a vinyl group or a (meth)acryloxy group; leveling agents; fluorine-based surfactants; radical polymerization initiators, and the like, and combinations thereof, to prevent a spot or a stain during the coating, realize leveling characteristics, and/or block generation of a residue due to undevelopment.

Examples of the silane-based coupling agent may include without limitation trimethoxysilyl benzoic acid, γ-methacryl oxypropyl trimethoxysilane, vinyl triacetoxysilane, vinyl trimethoxysilane, γ-iso cyanate propyl triethoxysilane, γ-glycidoxy propyl trimethoxysilane, β-(3,4-epoxycyclohexyl)ethyltrimethoxysilane, and the like. These may be used singularly or in a mixture of two or more.

Examples of the fluorine-based surfactant may include without limitation a commercial product such as BM-1000® and BM-1100® (BM Chemie Inc.); MEGAFACE F 142D®, F 172®, F 173®, and F 183® (Dainippon Ink Kagaku Kogyo Co., Ltd.); FULORAD FC-135®, FULORAD FC-170C®, FULORAD FC-430®, and FULORAD FC-431® (Sumitomo 3M Co., Ltd.); SURFLON S-112®, SURFLON S-113®, SURFLON S-131®, SURFLON S-141®, and SURFLON 5-145® (Asahi Glass Co., Ltd.); and SH-28PA®, SH-190®, SH-193®, SZ-6032®, and SF-8428® (Toray Silicone Co., Ltd.) and the like. These may be used singularly or in a mixture of two or more.

The amount and type of additive may be adjusted according to desired properties.

According to another embodiment of the present invention, a light blocking layer manufactured using the black photosensitive resin composition is provided. The light blocking layer may be manufactured as follows.

(1) Application and Film Formation

The aforementioned black photosensitive resin composition can be coated to have a desired thickness, for example, a thickness ranging from about 0.9 μm to about 4.0 μm, on a substrate which undergoes a predetermined pretreatment, using a spin or slit coating method, a roll coating method, a screen-printing method, an applicator method, and the like. Then, the coated substrate can be heated at a temperature ranging from about 70° C. to about 90° C. for about 1 minute to about 10 minutes to remove a solvent.

(2) Exposure

The resultant film can be radiated by an active ray of about 200 nm to about 500 nm after putting a mask with a predetermined shape to form a desired pattern.

The radiation can be performed by using a light source such as a mercury lamp with a low pressure, a high pressure, or an ultra high pressure, a metal halide lamp, an argon gas laser, and the like. An X ray, an electron beam, and the like may be also used depending on a case.

Exposure process uses, for example, a light dose of about 500 mJ/cm$^2$ or less (with a 365 nm sensor) when a high pressure mercury lamp is used. However, the light dose may vary depending on kinds of each component of the black photosensitive resin composition, its combination ratio, and a dry film thickness.

(3) Development

After the exposure process, an alkali aqueous solution can be used to develop the exposed film by dissolving and removing an unnecessary part except the exposed part, forming an image pattern.

(4) Post-Treatment

The developed image pattern may be heated again or radiated by an active ray and the like for curing, in order to accomplish excellent quality in terms of heat resistance, photo resistance, close contacting properties, crack-resistance, chemical resistance, high strength, storage stability, and the like.

Therefore, the above black photosensitive resin composition may provide a pattern having improved high close-contacting force and linearity required for a light blocking layer.

Hereinafter, the present invention is illustrated in more detail with reference to the following examples. These examples, however, are not in any sense to be interpreted as limiting the scope of the invention.

(Preparation of Black Photosensitive Resin Composition)

Each black photosensitive resin composition according to Examples 1 to 3 and Comparative Examples 1 to 3 is prepared by mixing the components with a composition as provided in the following Table 1 and agitating the mixture for 6 hours.

(A) Pigment Dispersion (A-1) A pigment dispersion including two kinds of carbon black (mixing carbon black having a primary particle diameter of 30 nm and oil absorption of 35 ml/100 g and another carbon black having a primary particle diameter of 28 nm and oil absorption of 60 ml/100 g in a weight ratio of 75:25) is used. Herein, the pigment dispersion includes 20 wt % of the carbon black.

(A-2) A pigment dispersion including two kinds of carbon black (mixing carbon black having a primary particle diameter of 30 nm and oil absorption of 35 ml/100 g and another carbon black having a primary particle diameter of 28 nm and oil absorption of 60 ml/100 g in a weight ratio of 50:50) is used. Herein, the pigment dispersion includes 20 wt % of the carbon black.

(A-3) A pigment dispersion including two kinds of carbon black (mixing carbon black having a primary particle diameter of 30 nm and oil absorption of 35 ml/100 g and another carbon black having a primary particle diameter of 28 nm and oil absorption of 60 ml/100 g in a weight ratio of 25:75) is used. Herein, the pigment dispersion includes 20 wt % of the carbon black.

(A-4) A pigment dispersion including carbon black (a primary particle diameter of 30 nm and oil absorption of 35 ml/100 g) is used. Herein, the pigment dispersion includes 20 wt % of the carbon black.

(A-5) A pigment dispersion including carbon black (a primary particle diameter of 30 nm and oil absorption of 50 ml/100 g) is used. Herein, the pigment dispersion includes 20 wt % of the carbon black.

(A-6) A pigment dispersion including carbon black (a primary particle diameter of 28 nm and oil absorption of 60 ml/100 g) is used. Herein, the pigment dispersion includes 20 wt % of the carbon black.

(B) Binder Resin

A bisphenol fluorene epoxy acrylate acid addition resin is used.

(C) Photopolymerizable Monomer

Diphenylpentaerythritol hexaacrylate is used.

(D) Photopolymerization Initiator (D-1) IRGACURE OXE01 (Ciba Specialty Chemicals Co.) is used.

(D-2) IRGACURE OXE02 (Ciba Specialty Chemicals Co.) is used.

(E) Solvent (E-1) Propylene glycol methylether acetate is used.

(E-2) Diethylene glycolmethylethylether is used.

(F) Other Additive

F554 (C 6 type) made by DIC Co., Ltd. is used.

TABLE 1

(unit: part by weight)

| | | Examples | | | Comparative Examples | | |
|---|---|---|---|---|---|---|---|
| | | 1 | 2 | 3 | 1 | 2 | 3 |
| (A) pigment dispersion | (A-1) | 4445 | — | — | — | — | — |
| | (A-2) | — | 4445 | — | — | — | — |
| | (A-3) | — | — | 4445 | — | — | — |
| | (A-4) | — | — | — | 4445 | — | — |
| | (A-5) | — | — | — | — | 4445 | — |
| | (A-6) | — | — | — | — | — | 4445 |
| (B) binder resin | | 600 | 600 | 600 | 600 | 600 | 600 |
| (C) photopolymerizable monomer | | 190 | 190 | 190 | 190 | 190 | 190 |
| (D) photopolymerization initiator | (D-1) | 17 | 17 | 17 | 17 | 17 | 17 |
| | (D-2) | 17 | 17 | 17 | 17 | 17 | 17 |
| (E) solvent | (E-1) | 1800 | 1800 | 1800 | 1800 | 1800 | 1800 |
| | (E-2) | 3000 | 3000 | 3000 | 3000 | 3000 | 3000 |
| (F) additive | | 3 | 3 | 3 | 3 | 3 | 3 |

Evaluation 1: Measurement of Taper Angle of Pattern

The black photosensitive resin compositions according to Examples 1 to 3 and Comparative Examples 1 to 3 are respectively spin-coated to be about 1.3 μm thick on a glass substrate and pre-baked at about 100° C. for 90 seconds. Subsequently, the coated substrate is cooled down at room temperature for 60 seconds and then exposed by radiating an ultraviolet (UV) with 40 mJ/cm$^2$ by using a high pressure mercury lamp to lead a photo curing reaction. The exposed substrate is developed at room temperature in a 0.043% KOH aqueous solution in a spray method and then washed with a pure water solvent for 60 seconds. Subsequently, the washed substrate is dried at room temperature and post-baked at 230° C. in a convection oven for 30 minutes, obtaining a pattern. A 10 μm pattern side photograph is taken of the resultant pattern using a scanning electron microscope (VEGA 3 SB, TESCAN KOREA Co. Ltd.) to measure taper angle, and the photograph and results are provided in FIG. 2 to FIG. 7 and the following Table 2.

TABLE 2

|  | Ex. 1 | Ex. 2 | Ex. 3 | Comp. Ex. 1 | Comp. Ex. 2 | Comp. Ex. 3 |
| --- | --- | --- | --- | --- | --- | --- |
| Taper angle (°) | 46.3 | 65.5 | 78.9 | 34.5 | 81.1 | 82.4 |

Referring to Table 2 and FIG. 2 to FIG. 7, Examples 1 to 3 using a pigment dispersion including two kinds of carbon black having a different oil absorption according to one embodiment have a taper angle controlled into 40° to 80° compared with Comparative Examples 1 to 3 using a pigment dispersion including a single carbon black. In addition, referring to FIG. 2 to FIG. 7, Examples 1 to 3 exhibit excellent pattern linearity compared with Comparative Examples 2 and 3 and excellent pattern resolution compared with Comparative Example 1.

Evaluation 2: Measurement of Close-Contacting Force

Figure 1:
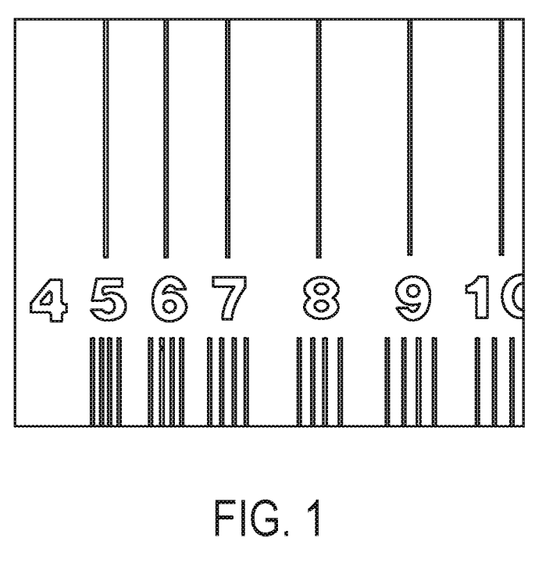
FIG. 1 is a photograph showing a pattern formed to measure a taper angle of a film pattern according to Example 1.
Figure 2:
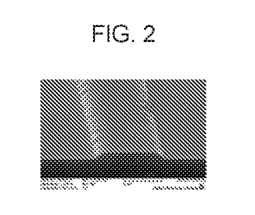
FIG. 2 is a scanning electron microscope (SEM) photograph showing a taper angle of the film pattern according to Example 1.
Figure 3:
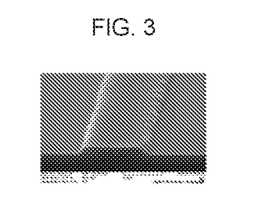
FIG. 3 is a scanning electron microscope (SEM) photograph showing a taper angle of a film pattern according to Example 2.
Figure 4:
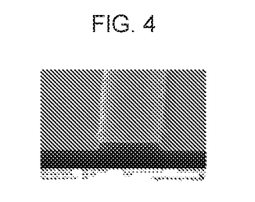
FIG. 4 is a scanning electron microscope (SEM) photograph showing a taper angle of a film pattern according to Example 3.
Figure 5:
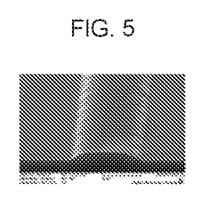
FIG. 5 is a scanning electron microscope (SEM) photograph showing a taper angle of a film pattern according to Comparative Example 1.
Figure 6:
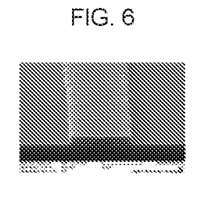
FIG. 6 is a scanning electron microscope (SEM) photograph showing a taper angle of a film pattern according to Comparative Example 2.
Figure 7:
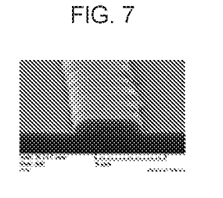
FIG. 7 is a scanning electron microscope (SEM) photograph showing a taper angle of a film pattern according to Comparative Example 3.
Figure 8:
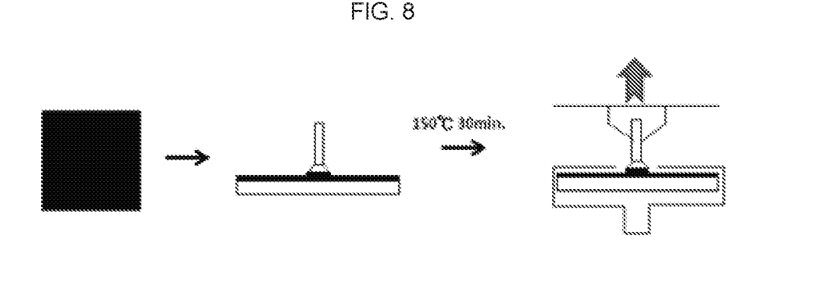
FIG. 8 is a schematic view showing a method of performing a pressure cooker test (PCT) for evaluating close-contacting force of the films according to Examples 1 to 3 and Comparative Examples 1 to 3.

The black photosensitive resin compositions according to Examples 1 to 3 and Comparative Examples 1 to 3 are respectively spin coated to be about 1.3 μm thick on a glass substrate and pre-baked at about 100° C. for 90 seconds. The coated substrate is cooled down at room temperature for 60 seconds and exposed by radiating an ultraviolet (UV) with 40 mJ/cm$^2$ without a mask by using a high pressure mercury lamp. The exposed substrate is washed with a pure water solvent for 60 seconds without a development process, dried at room temperature, and post-baked at 230° C. in a convection oven for 30 minutes. Subsequently, a stud pin with a sealant attached thereon is put on the black photosensitive resin layer as shown in FIG. 8 and then heat-treated at 150° C. for 30 minutes and fixed thereto. A close-contacting force measuring device (JS Engineering) is used to measure a force when the pin is detached from the resin layer by applying a force in a direction of the arrow shown in FIG. 8, and the results are provided in the following Table 3 and FIG. 9.

TABLE 3

| Close-contacting force (N) | Example 1 | Example 2 | Example 3 | Comparative Example 1 | Comparative Example 2 | Comparative Example 3 |
| --- | --- | --- | --- | --- | --- | --- |
| Maximum value | 278.0 | 259.3 | 255.0 | 240.6 | 235.0 | 304.0 |
| Minimum value | 238.0 | 215.6 | 205.0 | 194.2 | 180.0 | 243.2 |
| Average value | 255.9 | 240.6 | 231.6 | 221.3 | 211.4 | 271.3 |

Figure 9:
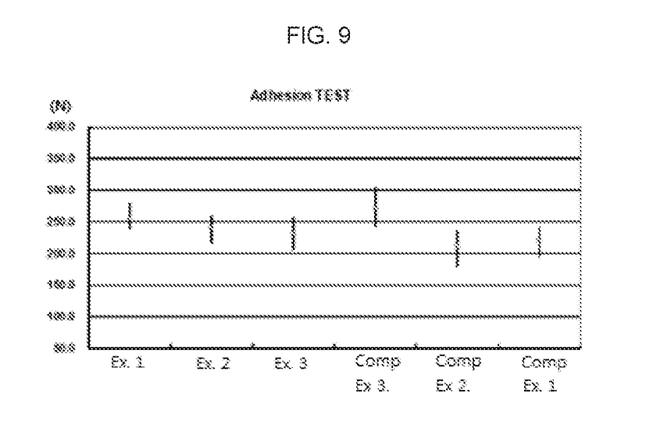
FIG. 9 is a graph showing pressure cooker test (PCT) results of the films according to Examples 1 to 3 and Comparative Examples 1 to 3.

Referring to Table 3 and FIG. 9, Examples 1 to 3 using a pigment dispersion including two kinds of carbon black having a different oil absorption according to one embodiment exhibit excellent close-contacting force compared with Comparative Examples 1 and 2 using a pigment dispersion using single carbon black. Comparative Example 3 exhibits too high a close-contacting force and deteriorated melting characteristics.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Therefore, the aforementioned embodiments should be understood to be exemplary but not limiting the present invention in any way.

What is claimed is:

1. A black photosensitive resin composition, comprising:
   (A) a pigment dispersion including at least two kinds of carbon black having different oil absorption from each other, wherein the pigment dispersion comprises carbon black having oil absorption ranging from 20 ml/100 g to 35 ml/100 g and another carbon black having oil absorption ranging from 60 ml/100 g to 80 ml/100 g;
   (B) a binder resin;
   (C) a photopolymerizable monomer;
   (D) a photopolymerization initiator; and
   (E) a solvent.

2. The black photosensitive resin composition of claim 1, comprising the carbon black having oil absorption ranging from 20 ml/100 g to 35 ml/100 g and the carbon black having oil absorption ranging from 60 ml/100 g to 80 ml/100 g in a weight ratio ranging from about 1:99 to about 99:1.

3. The black photosensitive resin composition of claim 1, comprising the carbon black having oil absorption ranging from 20 ml/100 g to 35 ml/100 g and the carbon black having oil absorption ranging from 60 ml/100 g to 80 ml/100 g in a weight ratio ranging from about 20:80 to about 80:20.

4. The black photosensitive resin composition of claim 1, wherein the at least two kinds of carbon black having different oil absorption from each other have a primary particle diameter of about 10 nm to about 50 nm.

5. The black photosensitive resin composition of claim 1, wherein the binder resin comprises a cardo-based binder resin, an acrylic-based binder resin, a polyimide-based binder resin, a polyurethane-based binder resin, or a combination thereof.

6. The black photosensitive resin composition of claim 1, wherein the binder resin comprises a cardo-based binder resin, and
   the cardo-based binder resin has a weight average molecular weight of about 1,000 g/mol to about 50,000 g/mol.

7. The black photosensitive resin composition of claim 1, wherein the black photosensitive resin composition comprises:
- about 1 wt % to about 50 wt % of the pigment dispersion (A);
- about 0.5 wt % to about 20 wt % of the binder resin (B);
- about 1 wt % to about 20 wt % of the photopolymerizable monomer (C);
- about 0.1 wt % to about 10 wt % of the photopolymerization initiator (D); and
- balance of the solvent (E).

8. The black photosensitive resin composition of claim 1, wherein the black photosensitive resin composition further comprises malonic acid; 3-amino-1,2-propanediol; a coupling agent having a vinyl group or a (meth)acryloxy group; a leveling agent; a fluorine-based surfactant; a radical polymerization initiator, or a combination thereof.

9. A light blocking layer manufactured using the black photosensitive resin composition of claim 1.

* * * * *